United States Patent
Ma et al.

(10) Patent No.: US 6,903,452 B2
(45) Date of Patent: Jun. 7, 2005

(54) PACKAGING MICROELECTROMECHANICAL STRUCTURES

(75) Inventors: Qing Ma, San Jose, CA (US); Valluri Rao, Saratoga, CA (US); Li-Peng Wang, Santa Clara, CA (US); John Heck, Mtn View, CA (US); Quan Tran, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/643,427

(22) Filed: Aug. 19, 2003

(65) Prior Publication Data

US 2004/0051181 A1 Mar. 18, 2004

Related U.S. Application Data

(62) Division of application No. 10/114,694, filed on Apr. 3, 2002, now Pat. No. 6,673,697.

(51) Int. Cl.[7] .......................... H01L 23/02; H01L 23/34; H01L 23/48
(52) U.S. Cl. .......................... 257/680; 257/724; 257/778
(58) Field of Search ................................. 257/680, 724, 257/678, 778

(56) References Cited

U.S. PATENT DOCUMENTS 6,140,144 A * 10/2000 Najafi et al. ................... 438/53
2001/0055836 A1   12/2001 Kunda

FOREIGN PATENT DOCUMENTS

EP        0 994 330 A1    4/2000

OTHER PUBLICATIONS

Brown et al., *Micromachined Micropackaged Filter Banks and Tunable Bandpass Filters*, Wireless Communications Conference, 1997, Proceedings Boulder, CO, USA Aug. 11–13, 1997, New York, NY, US, IEEE, USA, pp. 193–197.
Mayer et al., *Flip–Chip Packaging for Smart MEMS*, Smart Structures and Materials, 1998, Smart Electronics and MEMS, San Diego, CA, USA Mar. 2–4, 1998, Proceedings of the SPIE–The Intl. Society for Optical Engineering, 1998, SPIE–INT. Soc. Opt. Eng., USA, pp. 183–193.
Markus et al al., *Smart MEMS: Flip Chip Integration of MEMS and Electronics*, Proceedings of the SPIE, SPIE, Bellingham, VA, USA, vol. 2448, pp. 82–92.
Drayton et al., *Advanced Monolithic Packaging Concepts for High Performance Circuits and Antennas*, 1996 IEEE MTT–S Intl. Microwave Symposium Digest, San Francisco, Jun. 17–21, 1996, IEEE MTT–S Intl. Microwave Symposium Digest, New York, IEEE, USA, vol. 3, pp. 1615–1618.
Park et al, *Packaging of the RF–MEMS Switch*, Design Characterization and Packaging of MEMS and Microelectronics II, Adelaide, SA, Australia, Dec. 17–19, 2001, Proceedings of the SPIE—The Intl. Society for Optical Engineering, 2001, SPIE–Int. Soc. Opt. Eng., USA, pp. 234–243.

* cited by examiner

Primary Examiner—Amir Zarabian
Assistant Examiner—Kiesha Rose
(74) Attorney, Agent, or Firm—Trop, Pruner & Hu, P.C.

(57) ABSTRACT

A microelectromechanical system may be enclosed in a hermetic cavity defined by joined, first and second semiconductor structures. The joined structures may be sealed by a solder sealing ring, which extends completely around the cavity. One of the semiconductor structures may have the system formed thereon and an open area may be formed underneath said system. That open area may be formed from the underside of the structure and may be closed by covering with a suitable film in one embodiment.

10 Claims, 7 Drawing Sheets

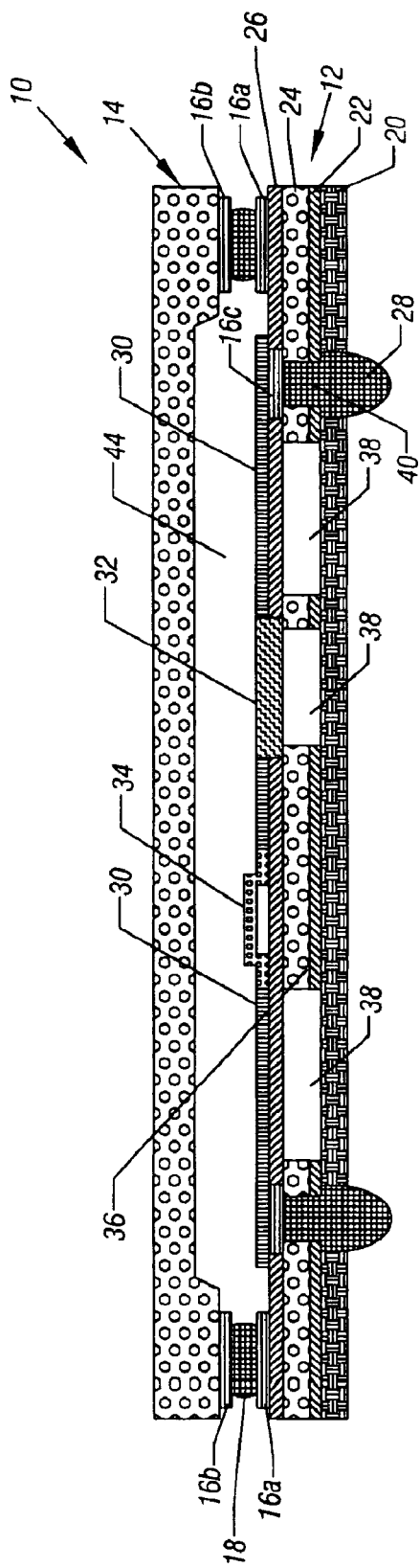
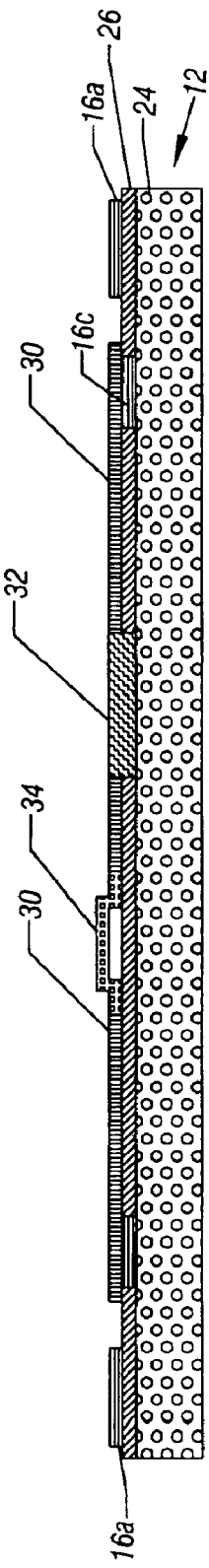

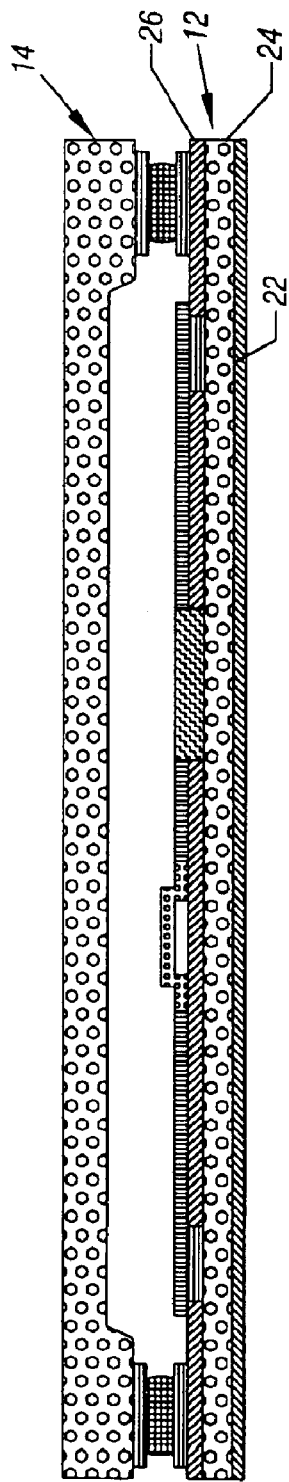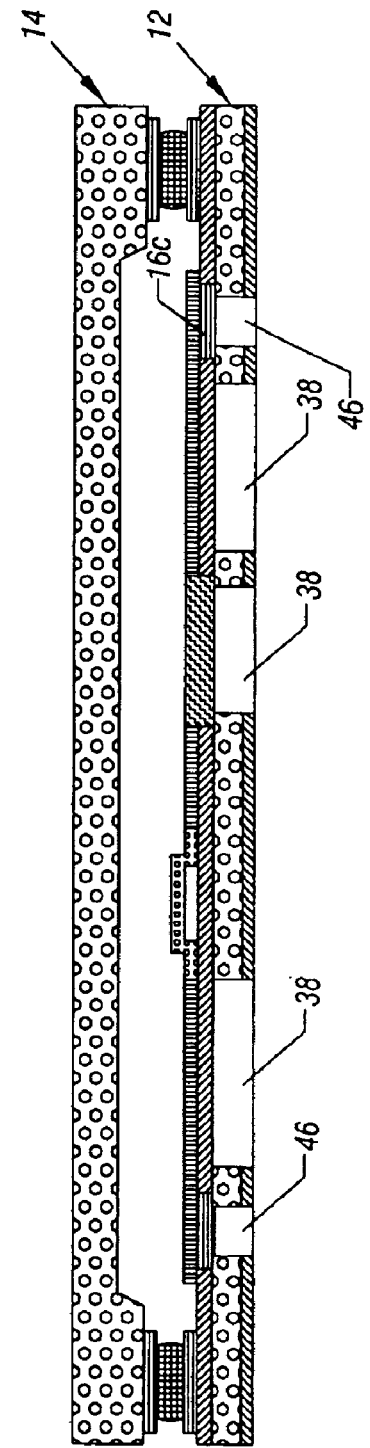
FIG. 5
FIG. 6

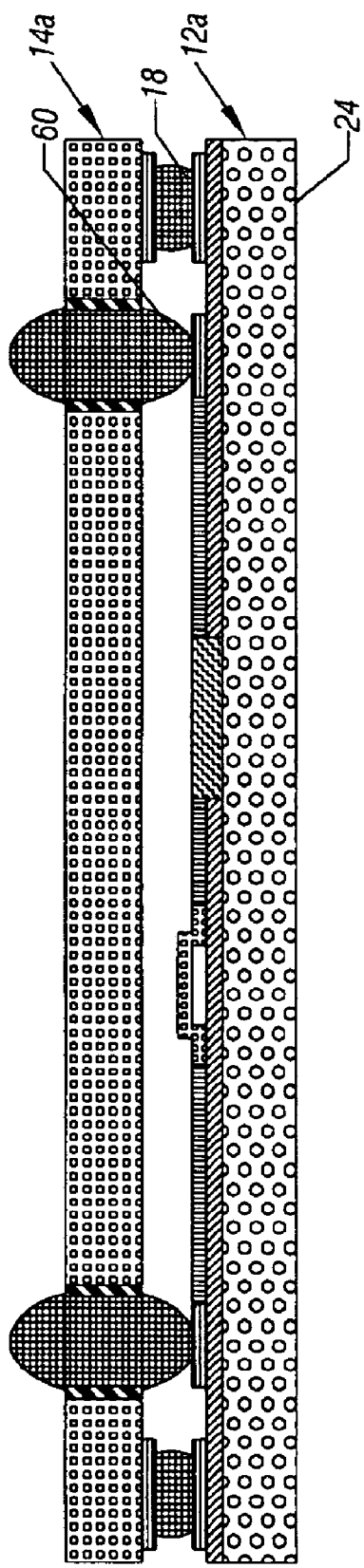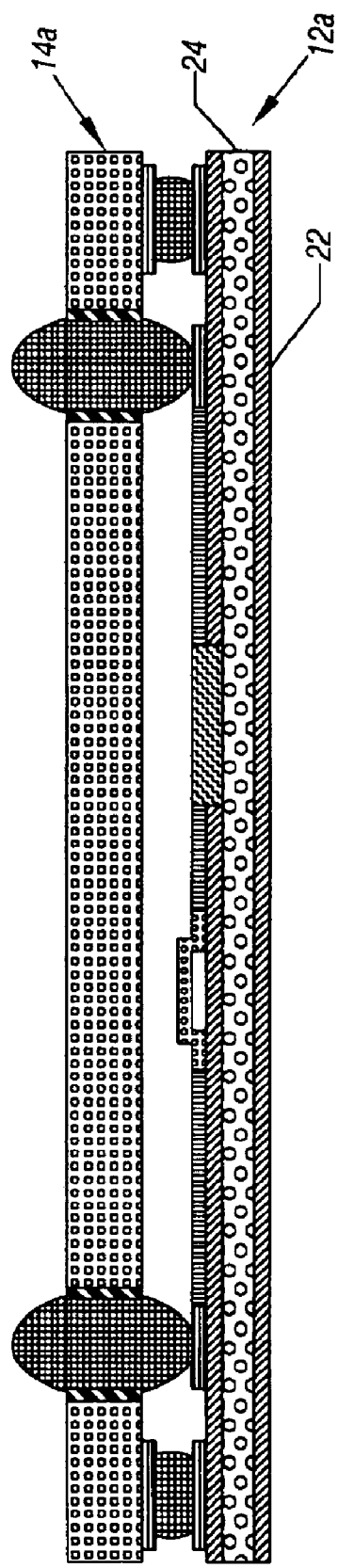

PACKAGING MICROELECTROMECHANICAL STRUCTURES

This is a divisional of prior application Ser. No. 10/114,694, filed Apr. 3, 2002, U.S. Pat. No. 6,673,697.

BACKGROUND

This invention relates generally to microelectromechanical systems (MEMS) and particularly to techniques for packaging MEMS.

In some cases, MEMS components such as varactors, switches and resonators need to be packaged in a hermetic environment. For example, particularly with radio frequency MEMS components, there may be a need for hermetic packaging. Such packaging protects the MEMS components from the outside environment.

Conventionally, two approaches have been utilized for hermetic packaging of MEMS components. Ceramic packages with cavities that may be sealed are used in the defense industry. This approach, while reliable, may be cost prohibitive for many commercial applications.

A second approach is to use a glass frit to bond a wafer containing the MEMS components to a cover. However, this technique requires high temperature bonding that may not be suitable for all components utilized in some MEMS applications. In some cases, the glass frit occupies a large area that increases the size of the resulting product and therefore increases its costs. In some cases, the glass frit bonding technology uses wire bonds for electrical connections that may not be adequate in some applications, such as high frequency applications.

Thus, there is a need for better ways to package MEMS components.

BRIEF DESCRIPTION OF THE DRAWINGS

FIG. 1 is an enlarged cross-sectional view of one embodiment of the present invention;

FIG. 2 is an enlarged cross-sectional view of the embodiment shown in FIG. 1 early in the manufacturing process in accordance with one embodiment of the present invention;

FIG. 5 is an enlarged cross-sectional view at a subsequent stage of the manufacturing process according to one embodiment;

FIG. 6 is an enlarged cross-sectional view at a subsequent stage of the manufacturing process according to one embodiment;

FIG. 11 is an enlarged cross-sectional view at a subsequent stage of manufacture in accordance with one embodiment of the present invention;

FIG. 12 is an enlarged cross-sectional view at a subsequent stage of manufacture in accordance with one embodiment of the present invention.

DETAILED DESCRIPTION

Figure 3:
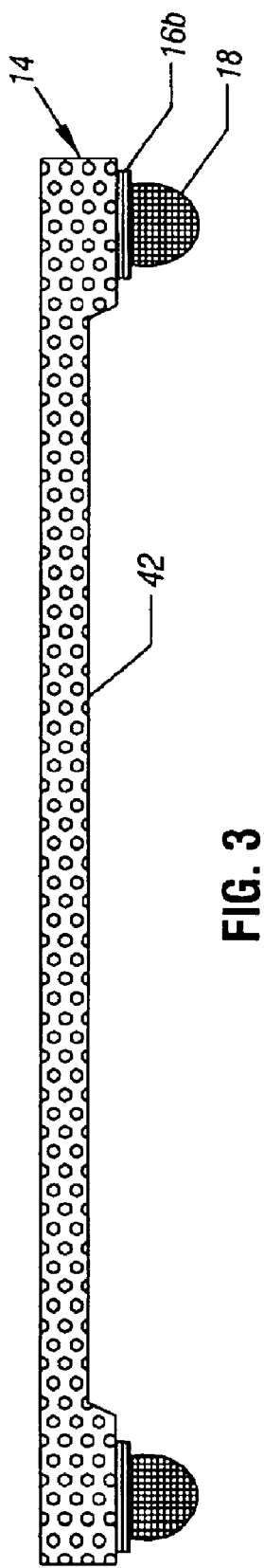
FIG. 3 is an enlarged cross-sectional view of the embodiment of FIG. 1 early in the manufacturing process according to one embodiment.

Referring to FIG. 1, a packaged microelectromechanical system (MEMS) 10 may include an upper semiconductor structure 14 and a lower semiconductor structure 12. The structures 12 and 14 are electrically and mechanically coupled through bond pads 16a and 16b and a vertical wall 18 that extend completely around the periphery of the system 10.

Within the system 10 is a MEMS device 34 that may be contained within a hermetic cavity 44. Also contained within the cavity 44 in one embodiment is a film bulk acoustic resonator (FBAR) 32 that includes a membrane positioned over an open area 38. Similarly, a transmission line 30 may be fabricated over another open area 38. An electrical connection from the exterior of the system 10 can be made by way of a surface mount connection 28, in one embodiment through a via 40 to a bond pad 16c that electrically contacts the transmission line 30. A transmission line 30 may electrically couple the film bulk acoustic resonator 32 or the MEMS switch 34 to a connection 28 for electrical connection to the exterior of the system 10.

The lower semiconductor structure 12 may include a layer 20 that closes the open areas 38. The bond pad 16a may be positioned on a layer 26 that, in one embodiment of the present invention, may be an insulator. In this way, electrical communication may be had between the transmission lines 30, the switch 34, the resonator 32, and other devices within the cavity 44 in the wall 18, through surface mount connections 28 in one embodiment of the present invention. At the same time, the various MEMS components such as a switch 34, the transmission line 30, and the resonator 32 may be electrically connected as desired. Some components, such as the resonator 32 and the transmission line 30, may be positioned over voids or open areas 38 in accordance with some embodiments of the present invention.

Referring to FIG. 2, the lower semiconductor structure 12 may be formed of a semiconductor substrate 24 that may be part of a wafer in one embodiment. An insulator layer 26 may be formed on the substrate 24. A bonding pad 16a may be formed on the insulator layer 26. Also defined over the insulator layer 26 is the MEMS switch 34 and the transmission lines 30. The transmission lines 30 may each be coupled to a bonding pad 16c. The film bulk acoustic resonator 32 may be formed directly over the substrate 24 in one embodiment of the present invention.

Referring next to FIG. 3, a cavity 42 may be formed in the upper semiconductor structure 14 that may be part of a wafer in one embodiment. The structure 14 may have a bonding pad 16b coupled to the vertical wall 18 that encircles the entire structure 14. The wall 18 may be made of solder or gold metal, in one embodiment.

Figure 4:
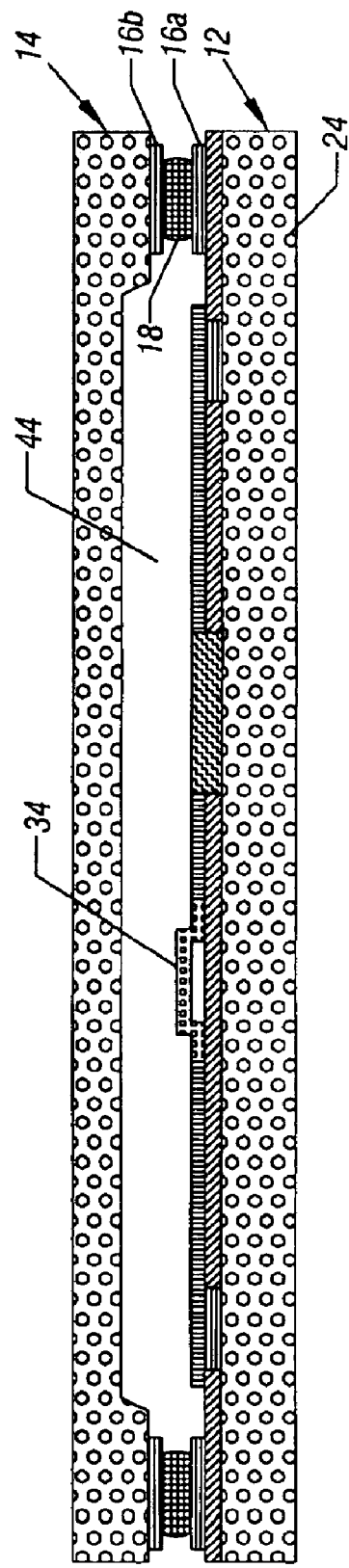
FIG. 4 is an enlarged cross-sectional view at a subsequent stage of the manufacturing process according to one embodiment.

The structures 12 and 14, shown in FIGS. 2 and 3, are then brought together, as shown in FIG. 4, and, in some cases, pressure may be applied. At moderate temperatures, the wall 18 seals to the bonding pad 16a sealingly forming a cavity 44. Depending on the environment in which the cavity 44 is formed, an appropriate atmosphere may be defined inside the cavity 44. Because surface mount techniques are utilized in some embodiments, the structure shown in FIG. 4 may be formed at temperatures of less than 300° C. In some cases, pressure may be applied to the structures 12 and 14 to ensure complete bonding.

Next, in some embodiments, the semiconductor substrate 24 may be thinned as shown in FIG. 5. Grinding or etching may be utilized in some embodiments and then a hard mask 22 may be formed. By thinning the wafer at this point, the bulk silicon etching time, in a later step, may be reduced also saving real estate if anisotropic etching is used in that subsequent step.

Turning next to FIG. 6, openings may be formed through the hard mask 22 and through the remainder of the semiconductor substrate 24 to form the open areas 38 and to form additional open areas 46. In some embodiments, a silicon bulk etch such as deep reactive ion etching (DRIE) or wet anisotropic etch may be utilized.

Figure 7:
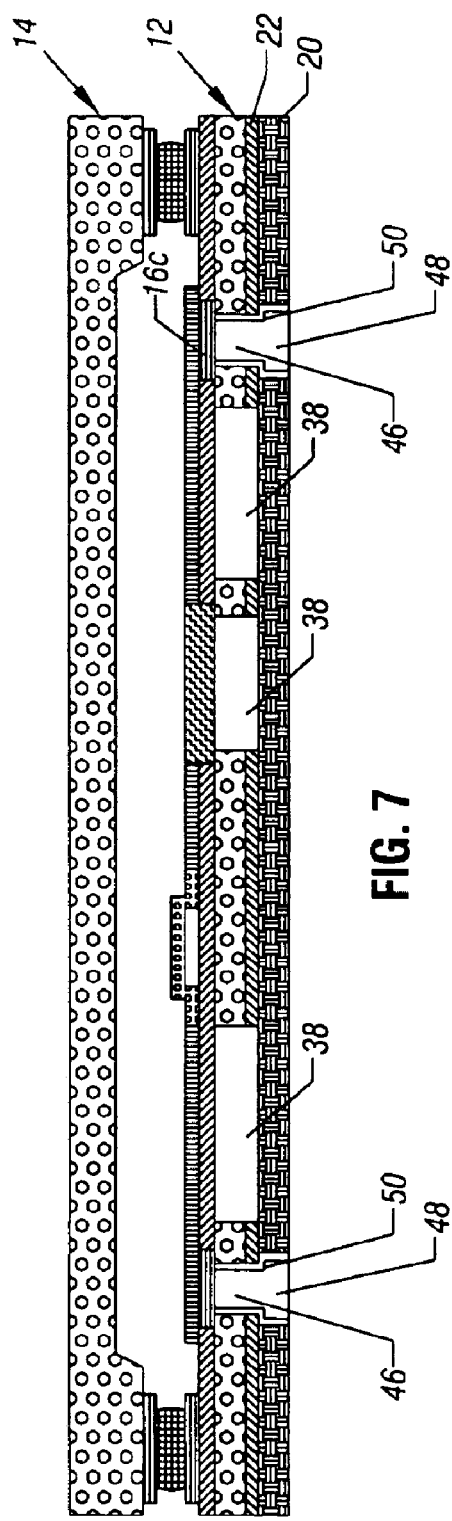
FIG. 7 is an enlarged cross-sectional view at a subsequent stage of the manufacturing process according to one embodiment.

Referring to FIG. 7, the layer 20 may be formed over an open area 38. The layer 20 may be a plastic or other organic film such as a polyimide film. In one embodiment, a KAPTON® foil from E.I. duPont de Nemours Co. (Wilmington, Del.) may be utilized. The layer 20 may be secured, for example, using glue, such as epoxy, to the hard mask 22. In addition, an enlarged opening 48 may be formed through the layer 20 to connect to the opening 46.

In some embodiments, a dielectric layer 50 may be formed on the sidewalls of the openings 46 and 48. The dielectric layer 50 may be useful in some embodiments to avoid reaction, for isolation, and to reduce parasitic capacitance. In some embodiments dielectric deposition may be achieved by low temperature vapor coating followed by a directional etch to clear the pads 16c.

Referring again to FIG. 1, solder may be screen printed or otherwise applied in the aperture formed by the openings 46 and 48 to form surface mount connections 28 and vias 40. As a result, electrical connection is available from the exterior of the system 10 through the connection 28 to the via 40 to the bond pad 16c and then on to the transmission line 30, in one embodiment of the present invention. The transmission line 30 may couple MEMS components such as the switch 34 and the FBAR 32. The FBAR 32 is now positioned as a membrane over an opening 38. Similarly, the transmission line 30 may be positioned over an opening 38, which may provide electrical isolation from the underlying substrate 24 to reduce the coupling of noise, for example.

In some embodiments, a variety of radio frequency MEMS components may be formed inside the same system 10. A switch 34 is an example of a MEMS device with a mechanically moving part that needs a solid substrate. The FBAR is an example of a membrane device located over an area where the silicon needs to be etched away. The devices 32 and 34 may be provided in a common cavity 44. It is also possible that multiple devices are located in the cavity 44 or that multiple devices are maintained in separate cavities.

By using a surface mountable wall 18 and moderate temperatures, the entire structure may be formed without interfering with delicate MEMS systems. Since the entire structure may be formed on a wafer at the wafer level, it is not necessary to deal with individual silicon dice in some embodiments. At the same time, electrical inputs and outputs may be readily realized using interconnects that run through the semiconductor structure 12 in one embodiment.

Semiconductor material underneath the transmission lines 30 may be etched away to reduce substrate losses, and semiconductor material under the resonator 32 may be removed to form a membrane. Even if the resulting lower structure 12 is weakened, the overall system 10 may have sufficient strength due to the operation of the upper semiconductor structure 14. In some embodiments, surface mounting techniques may be utilized which require lower temperatures and which provide better radio frequency connections than wire bond connections.

Figure 8:
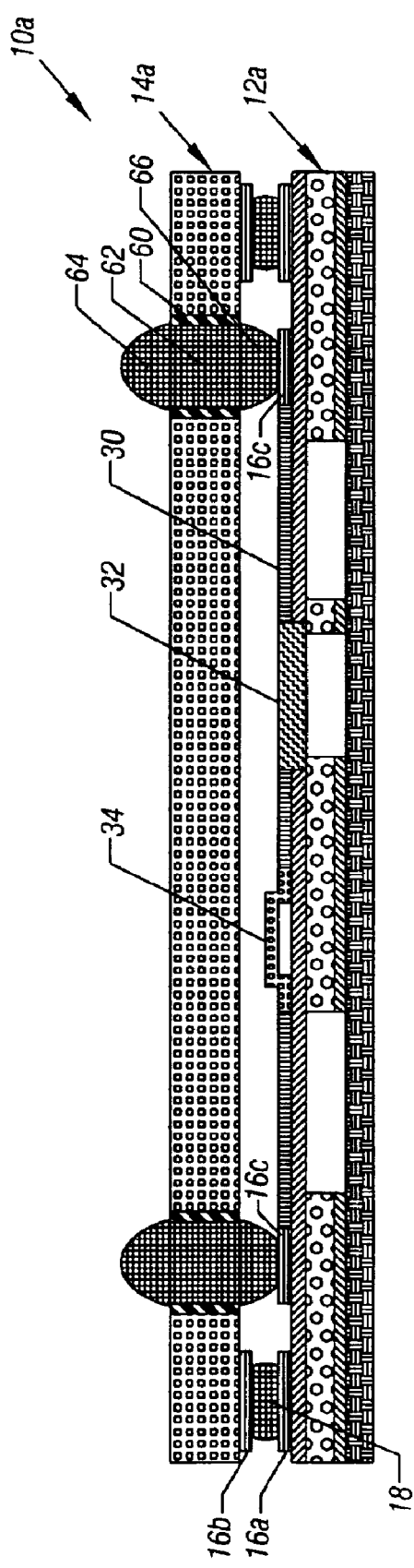
FIG. 8 is an enlarged cross-sectional view of another embodiment of the present invention.

Referring to FIG. 8, a MEMS system 10a includes a lower semiconductor structure 12a and an upper semiconductor structure 14a. In one embodiment, the upper structure 14a may be formed of glass to reduce substrate related parasitic capacitance and losses due to induced currents. Surface mount connections may be formed through the structure 14a instead of the structure 12a in some embodiments. Otherwise, the structure 12a is the same as the structure 12 shown in FIG. 1.

Electrical connections may be made through the structure 14a by a surface mount connection including an upper portion 64, an intermediate portion 62, and a lower portion 66. A dielectric coating 60 may be applied between the intermediate portion 62 and the structure 14a in some embodiments. The lower portion 66 may be surface mounted to a bonding pad 16c on the structure 12a. Surface mount connections may be made to external components using the upper portion 64, which may be a solder bump.

Figure 9:
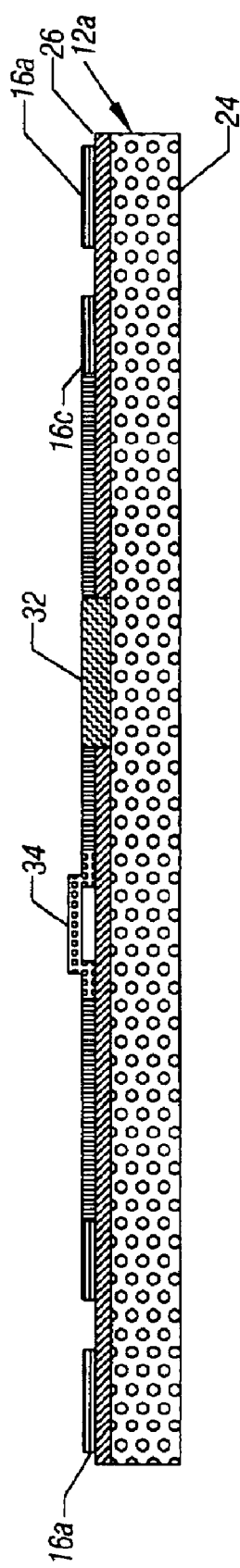
FIG. 9 is an enlarged cross-sectional view at an early stage of manufacturing the embodiment shown in FIG. 9 in accordance with one embodiment of the present invention.

The structure 12a, shown in FIG. 9, may include bonding pads 16c. The bonding pads 16c, sometimes referred to as a wettable layer, communicate with the transmission lines 30. The fabrication of the structure 12a is otherwise the same as the fabrication of structure 12 described previously.

Figure 10:
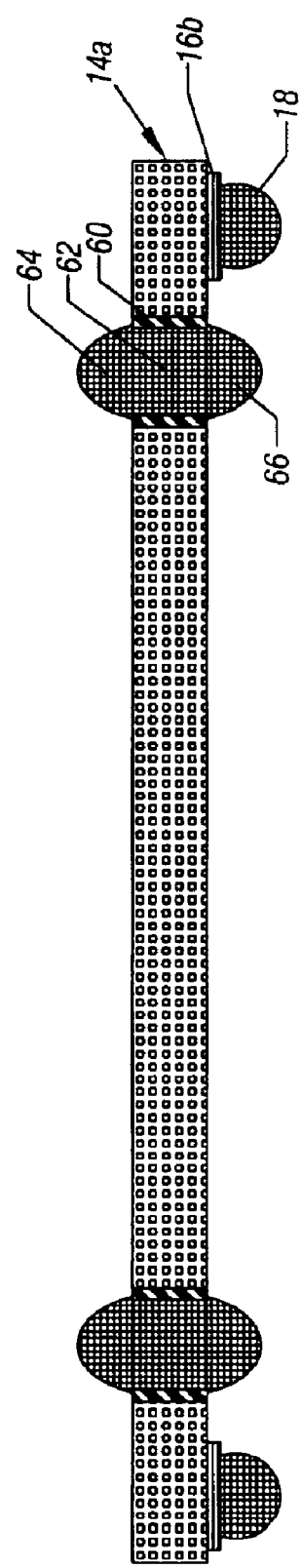
FIG. 10 is an enlarged cross-sectional view at an early stage of manufacture of the embodiment shown in FIG. 9 in accordance with one embodiment of the present invention.

The upper structure 14a may be a glass or ceramic wafer with wafer vias and solder bumps as shown in FIG. 10. The via holes may be formed by DRIE, powder blasting, or laser drilling, to mention a few examples. The dielectric layer 60 may be a coating that acts as a plating seed layer. The portions 62, 64, and 66 are plated in one embodiment.

The upper structure 14a and the lower structure 12a may be bonded to one another in a desired environment (such as nitrogen or vacuum) at moderate temperatures, for example, less than 300° C. as shown in FIG. 11. Adequate pressure may be applied for complete bonding. Surface mount techniques may be utilized to cause the lower portions 66 to surface mount to the bonding pads 16c.

The lower semiconductor structure 12a may then be processed as shown in FIG. 12, as described previously in connection with FIG. 5.

Figure 13:
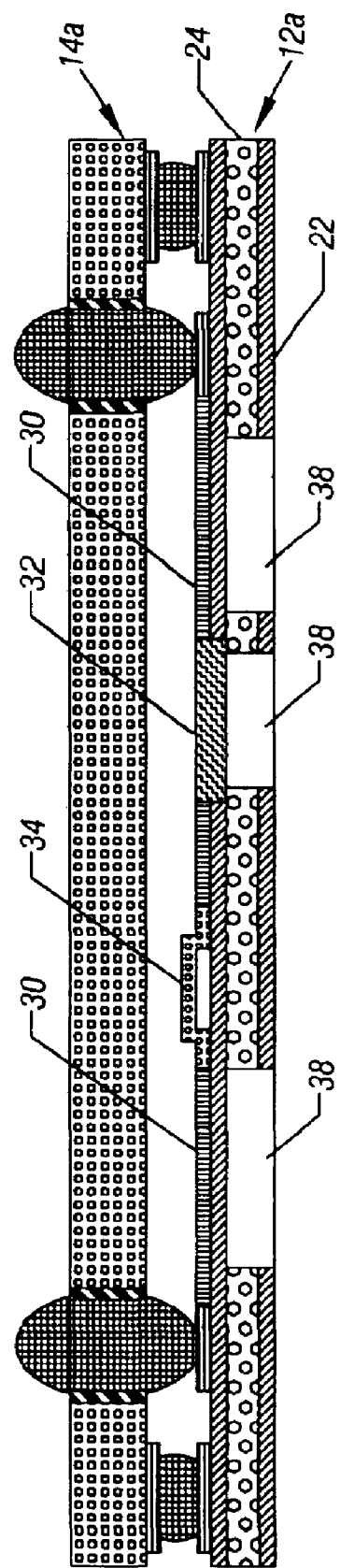
FIG. 13 is an enlarged cross-sectional view at a subsequent stage of manufacture in accordance with one embodiment of the present invention.

Similarly, as shown in FIG. 13, the open areas 38 and 36 may be formed, as described previously in connection with FIG. 7. The open areas 46 are unnecessary. The layer 20 may then be applied as shown in FIG. 1 to define the open areas 38, as described previously in connection with FIG. 8.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A device comprising:
   a first semiconductor structure having front and back sides;
   a microelectromechanical system formed on said front side of said first structure;
   a second structure bonded to said first structure by a surface mount connection, said connection including a solder bump that defines a hermetic cavity between said first and second structures surrounding said system;

an open area in said first structure under said system; and a film applied to the back side of said first semiconductor structure forming said open area between said first semiconductor structure and said film.

2. The device of claim 1 wherein said film is a plastic film.

3. The device of claim 2 wherein said film is adhesively secured to said back side.

4. The device of claim 1 wherein said first and second structures are semiconductor structures.

5. The device of claim 1 wherein said second structure is an insulator.

6. The device of claim 5 wherein said second structure is glass.

7. The device of claim 6 including an aperture through said second structure said aperture being filled by a solder bump that extends completing through said second structure.

8. The device of claim 1 wherein said system is a film bulk acoustic resonator.

9. The device of claim 1 wherein said system is a switch.

10. The system of claim 1 wherein said system is a transmission line.

* * * * *